(12) United States Patent
Auer

(10) Patent No.: US 6,338,196 B1
(45) Date of Patent: Jan. 15, 2002

(54) METHOD OF FORMING HEAT SINKS HAVING FULLY ANODIZED SURFACES

(75) Inventor: Carl Auer, Fountain Hills, AZ (US)

(73) Assignee: Auer Precision Company, Inc, Mesa, AZ (US)

( * ) Notice: Subject to any disclaimer, the term of this patent is extended or adjusted under 35 U.S.C. 154(b) by 0 days.

(21) Appl. No.: 09/464,224

(22) Filed: Dec. 15, 1999

(51) Int. Cl.[7] ................................................ B23P 15/26
(52) U.S. Cl. ...................................... 29/890.03; 29/557
(58) Field of Search .............................. 29/890.03, 557; 165/80.3, 185

(56) References Cited

U.S. PATENT DOCUMENTS

| | | | |
|---|---|---|---|
| 4,620,215 A | | 10/1986 | Lee |
| 5,156,720 A | * | 10/1992 | Rosenfeld et al. ............. 205/76 |
| 5,444,909 A | * | 8/1995 | Mehr .......................... 29/827 |
| 5,672,548 A | * | 9/1997 | Culnane et al. ............. 257/902 |
| 5,744,863 A | * | 4/1998 | Culnane et al. ............. 257/712 |
| 5,847,929 A | | 12/1998 | Bernier et al. |
| 6,068,051 A | * | 5/2000 | Wendt ........................ 165/185 |

* cited by examiner

Primary Examiner—I Cuda Rosenbaum
(74) Attorney, Agent, or Firm—John D. Titus; Gallagher & Kennedy P.A.

(57) ABSTRACT

Heat sinks suitable for use, for example, as semiconductor heat sinks are formed from a unitary precision stamping consisting of at least one rail to which are attached a plurality of heat sink elements. Each of the heat sink elements is attached to the rail by a bridge region of reduced thickness. The heat sinks, supported by the rail member, may be subjected to the anodizing treatment or other surface coating treatment while still attached to the rail. The thickness of the area of reduced thickness is chosen to correspond to the design thickness of the anodized coating. Since the anodized coating penetrates the surface of the part being anodized, by selecting the appropriate thickness for the region of reduced thickness, the anodized coating can be made to fully penetrate the bridge region such that when the heat sink is separated from the rail member, the anodic film completely covers the heat sink, without the presence of bare spots typical of prior art rack-anodized heat sinks.

6 Claims, 2 Drawing Sheets

METHOD OF FORMING HEAT SINKS HAVING FULLY ANODIZED SURFACES

FIELD OF THE INVENTION

The present invention relates to semiconductor packaging, specifically to heat sinks for packaging electronic components.

BACKGROUND OF THE INVENTION

As is well known in the art, active semiconductor components generate heat during switching. As integrated circuit devices have grown in size, with higher and higher levels of device density on each chip, the specific power consumption of these devices has increased substantially. The increase in specific power consumption, and concomitant power dissipation, creates the need for packaging arrangements that can conduct away sufficient amounts of the power dissipated by the chip to maintain sufficiently low device junction temperatures to achieve reliable, long-life circuit operation. Although historically heat dissipation through the component leads was adequate to maintain device temperature for low density integrated circuit devices, modern high density integrated circuits require heat sinks or heat spreaders in order to maintain device temperature at an acceptably low level.

Conventionally, heat sinks for semiconductor packages comprise stampings, extrusions, or photochemically machined components that are brazed or bonded to the chip to increase the dissipation of heat by convection directly to the surrounding air. The materials used for semiconductor heat sinks are most commonly stainless steel, copper, and aluminum. Of these, aluminum is most often preferred due to its low thermal inertia and low cost. Aluminum heat sinks, however, in most cases must be protected from corrosion typically by application of an electrolytic treatment such as electroplating or anodizing. Aluminum and magnesium are particularly well suited to anodizing, but other metals such as zinc, beryllium, titanium, zirconium, and thorium also respond to anodic treatment. Anodizing is similar to electroplating in that the part to be treated is immersed in a chemical bath and an electric current passed through the part. Anodizing differs from electroplating, however, in two ways. In electroplating, the work piece is made the cathode and the metallic coatings are deposited on the work piece. In anodizing, the work piece is made the anode, and its surface is converted to form an oxide that is integral with the metal substrate. The metallic portion of the electrolyte container is made the cathode.

Anodizing of small parts with certain shapes can be conducted using a perforated basket. Anodizing of the flat heat sinks most commonly used in integrated circuit packaging, however, currently must be carried out with the heat sinks individually racked, usually by hand. The rack serves to conduct the current from the current source to the heat sink and also to hold the heat sinks firmly under the agitated electrolyte. The process of hand loading the heat sinks onto a rack for anodizing adds substantial cost to the anodizing process. Moreover, the area of the rack that contacts the part must be sufficiently large to carry the unit amperage required for the anodizing process, and the part must be positioned to avoid gas pockets and to ensure positive solution sweep over the part. Accordingly, rack marks are left on the part in varying sizes. These rack marks areas have no anodic film, and therefore, are open to attack by corrosive agents.

Accordingly, what is needed is a semiconductor heat sink that is suitable for anodizing or the application of other coatings that can be processed without racking and which will produce a part that is free from unprotected rack marks.

SUMMARY OF THE INVENTION

The present invention comprises a unitary precision stamping consisting of a rail to which are attached a plurality of heat sinks. Each of the heat sinks is attached to the rail by a bridge region of reduced thickness. The heat sinks, supported by the rail member, may be subjected to the anodizing treatment or other surface coating treatment while still attached to the rail. Once the anodizing or other surface treatment is completed, the heat sinks can be separated from the rail member conventional means such as trimming or bending the heat sinks away from the rail to cause the area of reduced thickness to fracture. The area of reduced thickness may run the full length of the heat sink or may comprise a necked region having a lateral dimension that is less than the corresponding lateral dimension of the heat sink. Optimally, the thickness of the area of reduced thickness is chosen to correspond to the design thickness of the anodized coating. Since the anodized coating penetrates the surface of the part being anodized, by selecting the appropriate thickness for the region of reduced thickness, the anodized coating can be made to fully penetrate the bridge region such that when the heat sink is separated from the rail member, the anodic film completely covers the heat sink, without the presence of bare spots.

BRIEF DESCRIPTION OF THE DRAWING

The present invention will be better understood from a reading of the following detailed description, taken in conjunction with the accompanying drawing figures in which.

DETAILED DESCRIPTION

Figure 1:
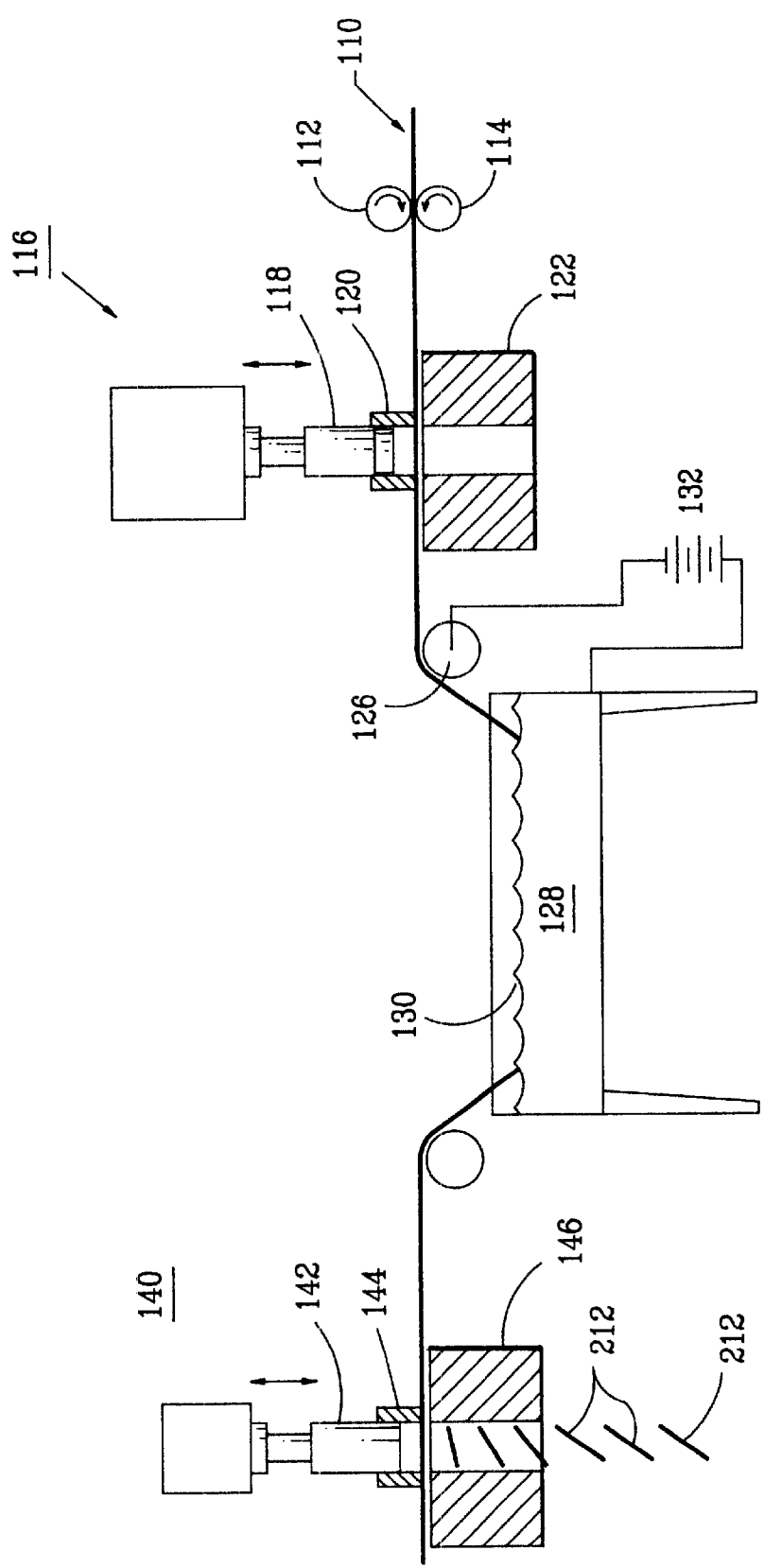
FIG. 1. is a schematic representation of a process for forming semiconductor heat sinks in accordance with the present invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms left, right, front, back, top, bottom, over, under, and the like in the description and in the claims, if any, are used for descriptive purposes. However, it is understood that the embodiment of the invention described herein is capable of operation in other orientations than described or illustrated herein. It is further understood that the terms so used are for the purposes of describing relative positions and are interchangeable under appropriate circumstances.

Figure 2:
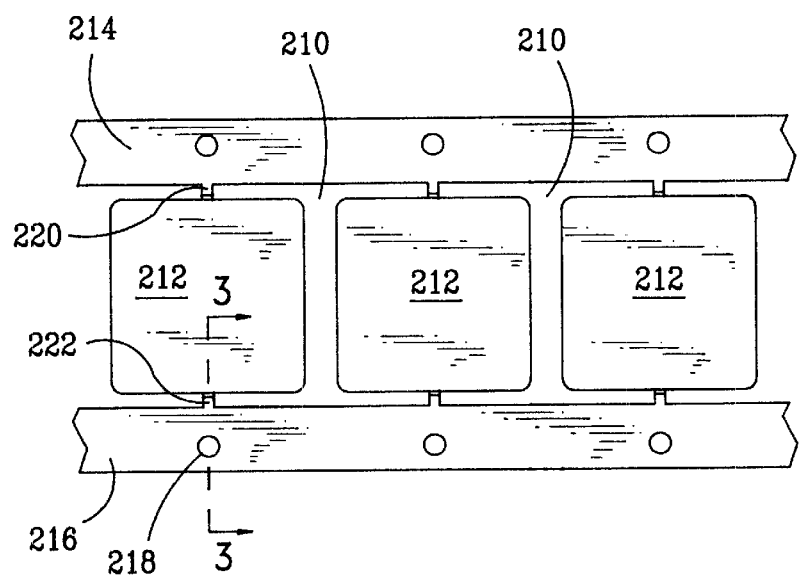
FIG. 2 is a plan view of a unitary precision stamping having a plurality of heat sinks incorporating features of the present invention.

FIG. 1 is a schematic representation of a process for producing anodized heat sinks in accordance with the present invention. According to the exemplary process shown in FIG. 1, strip 110 of metallic material such as aluminum, magnesium or other material that responds to anodic treatment is fed by a plurality of feed rollers 112, 114 into a first press 116. Press 116 comprises a reciprocating punch 118 that passes through a corresponding stripper 120 into a corresponding die 122. As shown in FIG. 2, as the strip 110 of material advances through first press 116, a series of apertures 210 are successively punched in strip 110. The apertures 210 define a seines of heat sinks 212 supported by a right rail member 214 and a left rail member 216. A plurality of registration holes such as registration hole 218 may be punched in rails 214 and 216 to provide registration for subsequent operations. Apertures 210 further define a plurality of bridges such as bridges 220 and 222 between heat sink 212 and rails 214 and 216, respectively.

Figure 3:
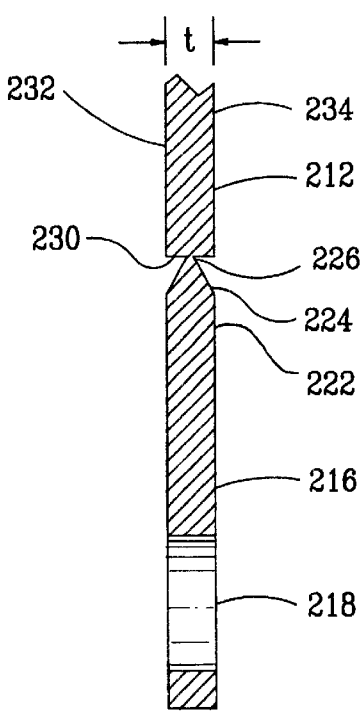
FIG. 3 is a partial cross-sectional view of the unitary precision stamping of FIG. 2 taken along line 3—3.

FIG. 3 is a cross-sectional view of a portion of the unitary precision stamping of FIG. 2 taken along line 3—3 of FIG. 2. As shown in FIG. 3, bridge 222 comprises a region of reduced thickness 224 relative to the thickness "t" of heat sink 212. The cross-sectional profile of the region of reduced thickness 224 may be in the form of a double wedge, a straight-walled notch, or other conventional geometric form. Preferably, however, the cross-sectional profile of the region of reduced thickness 224 is in the form of a single wedge as shown in FIG. 3. The single wedge cross-sectional profile permits the point of minimum thickness 226 to abut perimeter surface 230 of heat sink 212. Preferably, the chord of the point of minimum thickness is perpendicular to rear surface 232 of heat sink 212 (as used herein, the chord of the point of minimum thickness is the cross-sectional line of minimum length that will pass from one side of the point of minimum thickness 226 to the other). By forming the point of minimum thickness immediately adjacent perimeter wall 230 and with a chord that is orthogonal to rear surface 232 of heat sink 212 (parallel to perimeter surface 230), when heat sink 212 is ultimately separated from rail 216, perimeter surface 110 will have a clean parting line and, as discussed further hereinafter, the anodic treatment will have penetrated through the region of minimum thickness 226 such that perimeter surface 230 will have an unbroken anodized surface even after heat sink 212 has been separated from rail 216. The region of reduced thickness 224 including the point of minimum thickness 226 are preferably formed by coining the appropriate region of bridges 220 and 222.

With reference again to FIG. 1, once strip 110 has passed through first press 116 and apertures 210 form therein, the unitary stamping consisting of heat sinks 212 and rails 214 and 216 pass over a feed roller 126 or through other conventional sheet metal handling equipment into an anodizing tank 128 filled with an electrolyte solution 130 such as chromic, sulfuric, or oxalic acid or other electrolytic solution well known in the art for producing an anodized coating. Feed roller 126 and anodizing tank 128 complete a circuit through electrolyte solution 130 from a power supply 132 through strip 110 immersed in electrolyte solution 130. The weight of anodic coating per unit area formed is dependent upon the thickness and porosity of the coating. The overall thickness of the anodic coating is generally determined by the total ampere minutes of current used during the anodic oxidation cycle. By selecting the proper combination of electrolyte and operating conditions, anodic coatings with definite predetermined characteristics can be formed.

Additional processing steps (not shown in FIG. 1) include cold water rinses, hot water seals, dichromate seals, nickel acetate seals, or other common processes to improve the finish and/or corrosion resistance of the anodic treatment. Once the final finish has been applied to strip 110, heat sinks 212 are separated from rails 214 and 216 by conventional means such as a second press 140 comprising a reciprocating punch 142 guided by a corresponding stripper 144 into a corresponding die 146. Other conventional methods such as shearing or fracturing may be used to separate heat sinks 212 from rails 214 and 216.

As is well known in the art, during the anodization process, the surface of the work piece is converted to a form of its own oxide that is integral with the metallic substrate. It is generally agreed that the oxide coating consists of two layers, with the initial layer forming against the surface of the part being anodized. This layer is frequently termed the "barrier layer," and it has distinct properties when compared with the succeeding layer. The barrier layer is relatively thin, very dense, non-porous, and may contain two forms of oxide, one crystalline and the other amorphous. The barrier layer's thickness, cell diameter, and pore outer, heavier layer of the anodic coating is assumed to be more porous with the pores stacked somewhat like parallel tubes extending through the layer from the surface nearly down to the barrier layer. Unlike plating, where the metal ions travel from the bath to the part and build up on the plated material by adding more plate, the anodic layer is always being formed from the underlying metallic surface and forcing the existing layer outward. The oxide last formed is always between the metal surface and the previously formed oxide. Thus, the process of forming an anodic coating consumes the work piece itself and gives the appearance of the anodic coating penetrating into the surface. If the surface being anodized is sufficiently thin, and/or the oxidation process of sufficient duration, the oxide coating will consume all of the metal and convert it into oxide.

With reference again to FIG. 3, for a given anodic coating to be formed on the front and rear surfaces 234 and 232, respectively, of heat sink 212, point of minimum thickness 226 is preferably formed to have a thickness dimension such that the entirety of the point of minimum thickness 226 is converted into oxide during the anodizing process. Accordingly, when heat sink 212 is sheared from rail 216, the, entirety of perimeter surface 230 is anodized to the appropriate thickness, including the portion that was formerly integral with bridge 222. As is also well known in the art, the oxide formed during the anodizing process is non-conductive. Accordingly, because the anodizing current that flows through heat sink 212 to form the anodized coating must travel through bridges 220 and 222, the point of minimum thickness 226 and the corresponding point on bridge 220 (not shown) may be designed to gradually limit the anodizing current as the oxide forms across the point of minimum thickness 226, thus providing a self-limiting anodizing treatment that is less sensitive to the actual applied current.

The disclosure of the present invention described herein is enabled and can be realized and practiced without undue experimentation. Although the best mode of carrying out the present invention contemplated by the inventor is disclosed hereinabove, practice of the present invention is not limited thereto. Furthermore, while the present invention has been particularly shown and described with reference to specific embodiments, it will be understood by those skilled in the art that various changes may be made to the embodiments herein without departing from the spirit or scope of the present invention. For example, although in the illustrative embodiment, heat sinks 212 are thin plates formed from a strip of material, other heat sink configurations such as extruded fin arrays and other configurations that heretofore have required hand racking for the application of an anodic coating may advantageously employ the methods and apparatus described herein all within the scope of the invention.

Accordingly, the disclosure of the present invention is not intended to be limiting. Instead, the disclosure of the present invention is intended to be illustrative of the scope of the present invention. It is intended that the scope of the present invention shall be limited only to the extent required by the appended claims and the rules and principles of applicable law. The appended claims are not to be interpreted as including means-plus-function limitations, unless such a limitation is expressly recited in a given claim using the phrase "means for".

What is claimed is:

1. A method of forming a plurality of anodized heat sinks comprising:

providing a strip of metallic material having a length dimension, a width dimension and a first thickness dimension;

stamping a plurality of apertures in said strip of metallic material to form a plurality of heat sinks disposed adjacent at least one rail member, each of said plurality of heat sinks comprising a member having at least a partially planar front surface, a partially planar rear surface and a perimeter surface joining said front surface with said rear surface, said front and rear surfaces defining a second thickness dimension proximal said perimeter surface, each of said plurality of heat sinks being attached to said at least one rail member by a bridge member having a front and a rear surface, said front and rear surfaces of said bridge member facing substantially parallel to said front and rear surfaces of a proximal one of said plurality of heat sinks, said bridge member comprising a region of reduced thickness relative to said second thickness dimension;

immersing said plurality of heat sinks in a solvent bath;

exposing said plurality of heat sinks to an electric current while in said solvent bath to form an anodic film on said plurality of heat sinks, said anodic film penetrating said front and rear surfaces of said plurality of heat sinks and said front and rear surfaces of said bridge member by a predetermined amount; and thereafter detaching at least one of said plurality of heat sinks from said at least one rail member by separating said bridge member.

2. The method of claim 1, wherein:

the step of stamping a plurality of apertures comprises forming a first and a second rail member disposed in a parallel, spaced-apart configuration with said plurality of heat sinks disposed therebetween.

3. The method of claim 1, wherein:

said region of reduced thickness is formed by coining a portion of said bridge member.

4. The method of claim 1, wherein said region of reduced thickness is formed such that said front and rear surfaces of said bridge member meet said perimeter surface at an angle substantially equal to ninety degrees.

5. The method of claim 1, wherein:

the step of separating said bridge member comprises breaking said bridge member.

6. The method of claim 1, wherein:

the step of separating said bridge member comprises cutting said bridge member.

* * * * *